United States Patent [19]

Hirano et al.

[11] Patent Number: 5,626,963
[45] Date of Patent: May 6, 1997

[54] HARD-CARBON-FILM-COATED SUBSTRATE AND APPARATUS FOR FORMING THE SAME

[75] Inventors: Hitoshi Hirano; Keiichi Kuramoto; Yoichi Domoto; Seiichi Kiyama, all of Moriguchi, Japan

[73] Assignee: Sanyo Electric Co., Ltd., Moriguchi, Japan

[21] Appl. No.: 259,480

[22] Filed: Jun. 14, 1994

[30] Foreign Application Priority Data

| Jul. 7, 1993 | [JP] | Japan | 5-167866 |
| Jul. 29, 1993 | [JP] | Japan | 5-188084 |
| Aug. 23, 1993 | [JP] | Japan | 5-207912 |

[51] Int. Cl.$^6$ .................................. C23C 16/26
[52] U.S. Cl. .................... 428/408; 428/336; 428/446; 428/698; 428/457
[58] Field of Search .................. 428/408, 446, 428/698, 457, 688

[56] References Cited

U.S. PATENT DOCUMENTS

| 4,647,494 | 3/1987 | Meyerson et al. | 428/216 |
| 4,707,384 | 11/1987 | Schachner et al. | 428/408 |
| 5,045,165 | 9/1991 | Yamashita | 204/192.16 |
| 5,175,658 | 12/1992 | Chung et al. | 360/103 |
| 5,380,349 | 1/1995 | Taniguchi et al. | 106/38.28 |

FOREIGN PATENT DOCUMENTS

| 0503822 | 9/1992 | European Pat. Off. |
| 3047888 | 7/1982 | Germany |
| 1317197 | 12/1989 | Japan |
| 2225672 | 9/1990 | Japan |
| 3175620 | 7/1991 | Japan |
| 4329879 | 11/1992 | Japan |
| 4318175 | 11/1992 | Japan |

*Primary Examiner*—Archene Turner
*Attorney, Agent, or Firm*—W. G. Fasse; W. F. Fasse

[57] ABSTRACT

A hard-carbon-film-coated substrate includes in stacked sequence a substrate, an intermediate layer, and a hard carbon film. The substrate consists of a metal or an alloy mainly composed of Ni or Al, or stainless steel. The intermediate layer is mainly composed of Ru, Si, Ge or carbon, or is a mixed layer including Ru, Si, or Ge mixed with at least one of carbon, nitrogen or oxygen, with a composition gradient across its thickness. An apparatus for forming the coated substrate especially includes means for forming the intermediate layer and means for forming the hard carbon film in the same vacuum chamber.

19 Claims, 11 Drawing Sheets

HARD-CARBON-FILM-COATED SUBSTRATE AND APPARATUS FOR FORMING THE SAME

BACKGROUND OF THE INVENTION

1. Field of the Invention

The present invention relates to a substrate coated with a hard carbon film which is applicable to a cutter such as an electric shaver or a thin-film head, and a method of and an apparatus for forming the same.

2. Description of the Background Art

In order to improve adhesion between a substrate such as a ceramic substrate or a silicon substrate and a diamond-like carbon film, it has generally been proposed to form an intermediate layer between the substrate and the diamond-like carbon film. Japanese Patent Laying-Open No. 1-317197 (1989) discloses a technique of forming an intermediate layer mainly composed of silicon on a substrate by plasma CVD, and then forming a diamond-like carbon film on the intermediate layer. The intermediate layer improves the adhesion of the diamond-like carbon film to the substrate as compared with the case of directly forming a diamond-like carbon film on a substrate.

However, no studies have been conducted relating to the formation of an intermediate layer between a diamond-like carbon film and a substrate of nickel (Ni), aluminum (Al) or stainless steel for application to a cutter such as an electric shaver cutter.

On the other hand, an apparatus described in Japanese Patent Laying-Open No. 3-175620 (1991) is known for forming a hard carbon film by plasma CVD. This apparatus is adapted to form a diamond-like carbon film, which is a hard carbon film, on a substrate by bias plasma CVD employing an ECR (electron cyclotron resonance) plasma CVD apparatus.

FIG. 12 typically illustrates such a conventional apparatus for forming a diamond-like carbon film. Referring to FIG. 12, microwave supply means 1 generates a microwave that passes through a waveguide 2 and a microwave inlet window 3 to be guided to a plasma generation chamber 4. This plasma generation chamber 4 is provided with a discharge gas inlet pipe 5 for introducing a discharge gas such as argon (At) gas. Further, a plasma magnetic field generator 6 is provided around the plasma generation chamber 4. Due to the action of a high-frequency magnetic field which is formed by the microwave and a magnetic field generated by the plasma magnetic field generator 6, a plasma of high density is formed in the plasma generation chamber 4. This plasma is guided to a vacuum chamber 8 in which a substrate 7 is arranged, along the magnetic field diverged by the plasma magnetic field generator 6.

The vacuum chamber 8 is provided therein with a reaction gas inlet pipe 9 for introducing methane ($CH_4$) gas serving as a raw material gas. The methane gas which is introduced into the vacuum chamber 8 by the reaction gas inlet pipe 9 is decomposed by action of the plasma, to form a carbon film. A high-frequency power source 10, with a frequency of 13.56 MHz, for example, is provided externally of the vacuum chamber 8 for applying a prescribed high-frequency voltage (RF voltage) to a substrate holder 11, thereby developing a negative self-bias in the substrate 7. Ions travel in the plasma at a lower speed than electrons, and hence, unlike the electrons, the ions cannot follow the potential deflection during application of the RF voltage. Thus, a large quantity of electrons are emitted toward the substrate 7 due to application of the RF voltage, whereby a negative self-bias is developed in the substrate 7. Thus, positive ions contained in the plasma are drawn to form a diamond-like carbon film on the substrate 7.

In such a conventional apparatus, the substrate 7 is mounted on the substrate holder 11 which is provided in the vacuum chamber 8, and thereafter the vacuum chamber 8 is evacuated for forming a film. Thus, this apparatus can treat only one substrate, or two substrates at the most, in a single film forming operation.

In the conventional apparatus, further, discharge is also caused in the vicinity of a portion of the substrate that is mounted on the substrate holder, i.e. a portion of the substrate that is not to be provided with a film. This effect disadvantageously increases the temperature of the substrate.

SUMMARY OF THE INVENTION

An object of the present invention is to provide a hard-carbon-film-coated substrate comprising a substrate of a metal or an alloy which is mainly composed of Ni or Al, or stainless steel, and a hard carbon film provided thereon, with excellent adhesion between the substrate and the hard carbon film.

Another object of the present invention is to provide a hard carbon film forming apparatus that can simultaneously treat a plurality of substrates in a single process while preventing excess temperature increase of the substrates, for effectively forming hard carbon films on the substrates.

The concept of the hard carbon film according to the present invention also includes a crystalline carbon film or amorphous diamond-like carbon film.

A hard-carbon-film-coated substrate according to a first aspect of the present invention comprises a substrate consisting of a metal or an alloy mainly composed of Ni or Al, or stainless steel, an intermediate layer mainly composed of Ru formed on the substrate, and a hard carbon film formed on the intermediate layer.

According to the first aspect of the present invention, the intermediate layer mainly composed of Ru is provided between the substrate and the hard carbon film. Adhesion between the substrate and the hard carbon film is improved by such an intermediate layer.

The intermediate layer is preferably a mixed layer of Ru and at least one element of carbon, nitrogen and oxygen. The composition ratio of such a mixed layer is preferably graded along its thickness. In other words, the mixed layer preferably has a graded composition structure or gradient with a higher Ru content closer to the substrate and a higher content of carbon, nitrogen and/or oxygen closer to the hard carbon film.

A method of forming the diamond-like carbon film coated substrate according to the first aspect of the present invention comprises a step of emitting ions of an inert gas toward a substrate arranged in a vacuum chamber while simultaneously emitting material atoms for forming an intermediate layer from an evaporation source toward the substrate thereby forming an intermediate layer on the substrate, and a step of supplying a reaction gas containing carbon into the vacuum chamber for forming a plasma and emitting the plasma toward the intermediate layer thereby forming a hard carbon film on the intermediate layer.

A hard-carbon-film-coated substrate comprising an intermediate layer that is a mixed layer of Ru and at least one element of carbon, nitrogen and oxygen can be formed by any of the following methods.

One method according to the first aspect of the present invention comprises a step of supplying a reaction gas containing carbon into a vacuum chamber with a gradually increasing supply quantity for forming a plasma, and emitting the plasma toward a substrate arranged in the vacuum chamber while also emitting ions of an inert gas toward the substrate and simultaneously emitting material atoms for forming an intermediate layer from an evaporation source toward the substrate at a gradually reducing evaporation rate thereby forming an intermediate layer consisting of a mixed layer of the material atoms and carbon, nitrogen and/or oxygen on the substrate. The method further comprises a step of supplying a reaction gas containing carbon, nitrogen and/or oxygen into the vacuum chamber for forming a plasma, and emitting the plasma toward the intermediate layer thereby forming a hard carbon film on the intermediate layer.

A hard-carbon-film-coated substrate according to a second aspect of the present invention comprises a substrate consisting of a metal or an alloy mainly composed of Ni or Al, or stainless steel, an intermediate layer mainly composed of Si or Ge formed on the substrate, and a hard carbon film formed on the intermediate layer.

According to the second aspect of the present invention, an intermediate layer mainly composed of Si or Ge is provided between the substrate and a diamond-like carbon film. Adhesion between the substrate and the diamond-like carbon film is improved by such an intermediate layer.

According to the second aspect of the present invention, the intermediate layer is preferably a mixed layer of Si or Ge and carbon, nitrogen or oxygen whose composition ratio is graded along its thickness. The mixed layer preferably has a higher Si or Ge content closer to the substrate and a higher carbon, nitrogen or oxygen content closer to the hard carbon film.

When the hard-carbon-film-coated substrate according to the second aspect of the present invention is used for an inner blade of an electric shaver, the intermediate layer is preferably in a range of 50 to 8000 Å in thickness.

When the hard-carbon-film-coated substrate according to the second aspect of the present invention is used for an outer blade of an electric shaver, on the other hand, the intermediate layer is preferably within a range of 50 to 4000 Å in thickness.

The effect of improving adhesion is reduced if the intermediate layer is too thin, while no further improvement in the adhesion is achieved if the thickness is increased beyond the aforementioned range.

A method of forming the hard-carbon-film-coated substrate according to the second aspect of the present invention comprises a step of sputtering material atoms for forming an intermediate layer by irradiation with ions of an inert gas, thereby forming an intermediate layer on a substrate arranged in a vacuum chamber. This method further comprises a step of supplying a reaction gas containing carbon into the vacuum chamber for forming a plasma and emitting the plasma toward the intermediate layer, thereby forming a hard carbon film on the intermediate layer.

One method according to the second aspect of the present invention comprises a step of supplying a reaction gas containing carbon, nitrogen or oxygen into a vacuum chamber with a gradually increasing supply quantity for forming a plasma and emitting the plasma toward a substrate arranged in the vacuum chamber while sputtering material atoms for forming an intermediate layer by irradiating the same with ions of an inert gas with a gradually reducing or decreasing amount of irradiation, thereby forming an intermediate layer consisting of a mixed layer of the material atoms and carbon, nitrogen or oxygen. This method further comprises a step of supplying a reaction gas containing carbon into the vacuum chamber for forming a plasma and emitting the plasma toward the intermediate layer, thereby forming a hard carbon film on the intermediate layer.

According to this method, it is possible to form an intermediate layer having a graded structure.

A hard-carbon-film-coated substrate according to a third aspect of the present invention comprises a substrate consisting of a metal or an alloy mainly composed of Ni or Al, or stainless steel, an intermediate layer mainly composed of carbon formed on the substrate, and a hard carbon film formed on the intermediate layer.

According to the third aspect of the present invention, the intermediate layer mainly composed of carbon is provided between the substrate and a diamond-like carbon film. Adhesion between the substrate and the diamond-like carbon film is improved by such an intermediate layer.

When the hard-carbon-film-coated substrate comprising a carbon thin film as the intermediate layer is used for an inner blade of an electric shaver, the carbon thin film is preferably within a range of 50 to 8000 Å in thickness, while it preferably has a thickness of 50 to 4000 Å when the hard-carbon-film-coated substrate is used for an outer blade of an electric shaver.

The effect of improving adhesion is reduced if the intermediate layer is too thin, while no further improvement in adhesion is achieved if the thickness is in excess of the aforementioned range.

A hard-carbon-film-coated substrate according to the third aspect can be formed by the method according to the second aspect of the present invention.

A method according to a fourth aspect of the present invention is adapted to form a hard carbon film on a substrate, and comprises a step of generating a plasma of an inert gas by electron cyclotron resonance, a step of applying a high-frequency voltage to a substrate so that a self-bias developed in the substrate is not more than $-20$ V, and a step of emitting the plasma of the inert gas toward the substrate through an opening of a shielding cover which is provided above the substrate while supplying a reaction gas containing carbon gas into the plasma for forming a hard carbon film on the substrate.

In the method according to the fourth aspect of the present invention, the inert gas is preferably Ar gas, and the reaction gas containing carbon is preferably $CH_4$ gas. Such Ar gas and $CH_4$ gas are preferably supplied at partial pressures of at least $1.0 \times 10^{-4}$ Toor and not more than $20.0 \times 10^{-4}$ Torr.

A hard carbon film forming apparatus according to a fifth aspect of the present invention is adapted to form a hard carbon film on a substrate, and comprises a vacuum chamber, a substrate holder which is rotatably provided in the vacuum chamber, a shielding cover having an opening therein, which is provided to enclose a peripheral surface of the substrate holder, plasma generation means for generating a plasma in the vacuum chamber and emitting the plasma toward the substrate through the opening, reaction gas inlet means for supplying a reaction gas containing carbon into the plasma which is generated from the plasma generation means, and a high-frequency power source for applying a high-frequency voltage to the substrate holder so that a self-bias which is developed in the substrate goes negative.

A hard carbon film forming apparatus according to a sixth aspect of the present invention is adapted to form an intermediate layer on a substrate for further forming a hard carbon film on the intermediate layer, and comprises a vacuum chamber, a substrate holder which is rotatably provided in the vacuum chamber, a shielding cover having first and second openings therein, which is provided to enclose a peripheral surface of the substrate holder, plasma generation means for generating a plasma in the vacuum chamber and emitting the plasma toward the substrate through the first opening, reaction gas inlet means for supplying a reaction gas containing carbon into the plasma which is generated from the plasma generation means, a high-frequency power source for applying a high-frequency voltage to the substrate holder so that a self-bias which is developed in the substrate goes negative, and intermediate layer forming means provided in the vacuum chamber for emitting material atoms for forming an intermediate layer toward the substrate through the second opening.

An apparatus according to a seventh aspect of the present invention is an exemplary apparatus according to the sixth aspect, and is characterized in that the intermediate layer forming means comprises an evaporation source provided in the vacuum chamber for emitting the material atoms for forming an intermediate layer toward the substrate through the second opening, and an ion gun for emitting ions of an inert gas toward the substrate through the second opening simultaneously with emission of the material atoms from the evaporation source.

An apparatus according to an eighth aspect of the present invention is another exemplary apparatus according to the sixth aspect, and is characterized in that the intermediate layer forming means comprises a target consisting of the material atoms for forming an intermediate layer, which target is provided in the vacuum chamber for sputtering the material atoms toward the substrate through the second opening, and an ion gun for emitting ions of an inert gas toward the target for sputtering the same.

In the apparatus according to the present invention, the plasma generation means is preferably an electron cyclotron resonance plasma CVD apparatus.

In the apparatus according to the present invention, the shielding cover is preferably separated from the peripheral surface of the substrate holder at a distance of not more than a mean free path of the gas molecules, and more preferably 1/10 of the mean free path of the gas molecules.

In the apparatus according to the present invention, the shielding cover is preferably maintained at a prescribed potential, and is more preferably grounded.

In the apparatus according to the present invention, the material atoms for forming an intermediate layer are atoms of Si, Ru, carbon or Ge, or a mixture of Si, Ru, carbon or Ge and at least one of carbon, nitrogen and oxygen, for example, and the hard carbon film is formed at least indirectly on a substrate consisting of a metal or an alloy mainly composed of Ni or Al, or stainless steel, for example, through such an intermediate layer.

The apparatus according to the present invention comprises the substrate holder which is rotatably provided in the vacuum chamber. Therefore, it is possible to mount a plurality of substrates on the substrate holder, thereby increasing the number of substrates that can be treated with a single evacuation.

In the apparatus according to the present invention, the shielding cover is provided to enclose the peripheral surface of the substrate, so that the plasma which is generated from the plasma generation means is emitted through the opening of the shielding cover for forming the hard carbon film on the substrate. Due to such a shielding cover, it is possible to prevent the occurrence of discharge at locations other than those where it is intended to form the film, thereby suppressing a temperature increase of the substrate.

A method of forming the hard-carbon-film-coated substrate according to a ninth aspect of the present invention comprises a step of supplying a gas containing material atoms for forming an intermediate layer into a vacuum chamber for forming a plasma and emitting the plasma toward a substrate thereby forming an intermediate layer on the substrate. This method further comprises a step of supplying a reaction gas containing carbon into the vacuum chamber for forming a plasma and emitting the plasma toward the intermediate layer thereby forming a hard carbon film on the intermediate layer.

According to the sixth aspect of the present invention, the intermediate layer forming means is provided for emitting the material atoms for forming an intermediate layer toward the substrate through the second opening of the shielding cover. Therefore, it is possible to form the intermediate layer as well as the hard carbon film with a single evacuation. Further, it is possible to control the formation of the hard carbon film and that of the intermediate layer independently of each other. Thus, it is possible to form the hard carbon film after a desired intermediate layer is formed on the substrate.

Further, it is possible to control the material composition ratio of the intermediate layer as desired by alternately repeating deposition of the carbon film by plasma CVD through the first opening and deposition of the material atoms for forming an intermediate layer through the second opening. Thus, it is possible to bring the material composition ratio of the intermediate layer into a graded structure gradually approaching the composition of the hard carbon film toward the hard carbon film. Due to formation of the intermediate layer having such a graded structure, it is possible to further improve adhesion between the substrate and the hard carbon film.

In the apparatus according to the fifth aspect of the present invention, the substrate holder is provided in the vacuum chamber, so that a number of substrates can be mounted on the substrate holder. Thus, it is possible to increase the number of substrates that can be treated in a single evacuation.

The shielding cover is provided around the substrate holder, whereby it is possible to prevent the occurrence of discharge in the vicinity of a substrate portion other than that which is to be provided with the film. Thus, it is possible to form the film while maintaining the substrate at a low temperature, whereby it is unnecessary to consider the heat resistance of the substrate.

The apparatus according to the sixth aspect of the present invention is further provided with the intermediate layer forming means. Thus, it is possible to form the intermediate layer on the substrate in a single evacuation step.

Further, it is possible to change the material composition ratio of the intermediate layer by alternately forming thin films by the plasma generation means and by the intermediate layer forming means and changing the respective thin film forming conditions. Thus, it is possible to form an intermediate layer having a graded structure, thereby further improving the adhesion between the substrate and the hard carbon film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
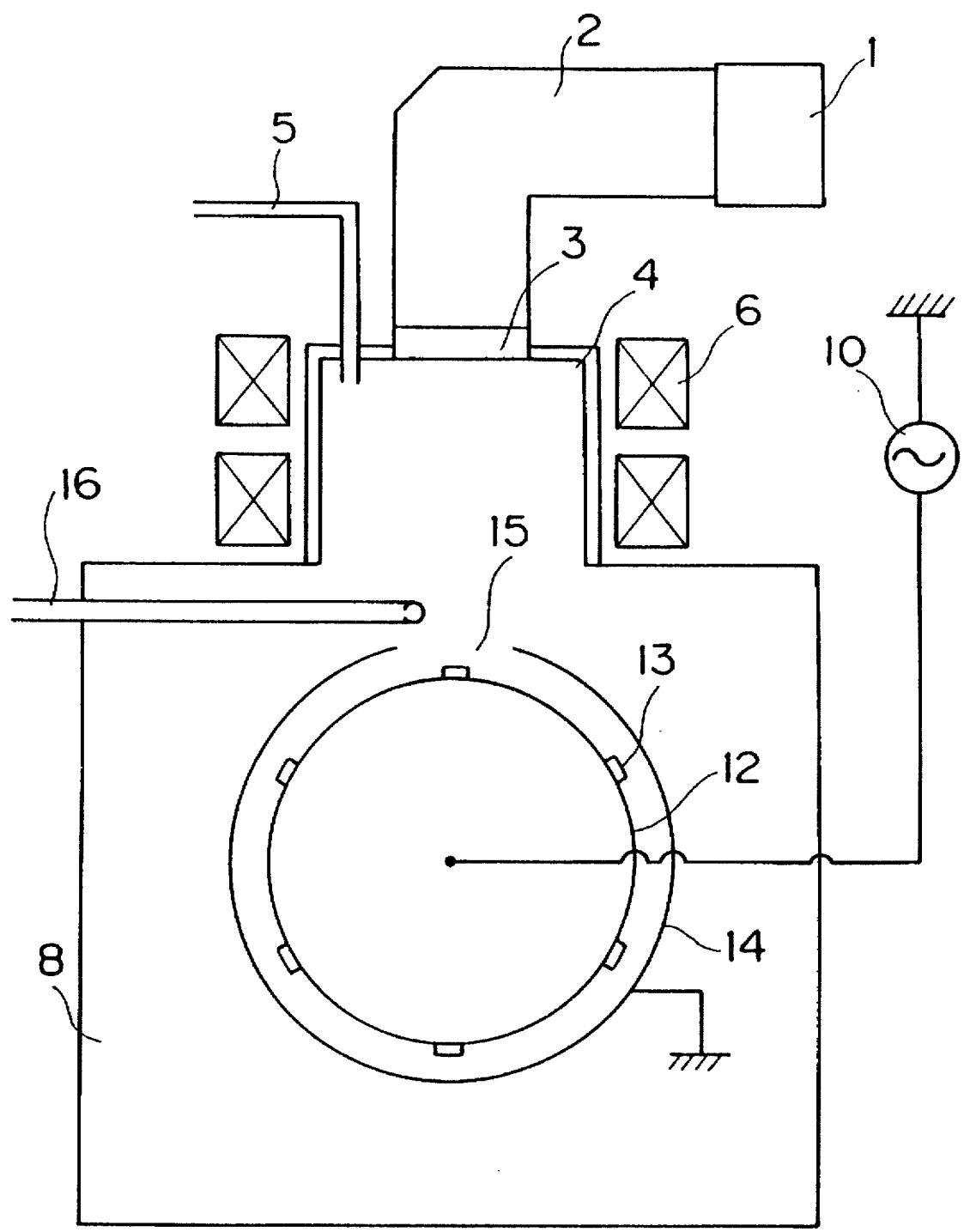
FIG. 1 is a schematic sectional view showing a hard carbon film forming apparatus in an embodiment according to the fifth aspect of the present invention.

FIG. 1 is a schematic sectional view showing an exemplary apparatus for forming a hard carbon film according to the present invention. Referring to FIG. 1, a plasma generation chamber 4 is provided in a vacuum chamber 8. An end of a waveguide 2 is mounted on the plasma generation chamber 4, while microwave supply means 1 is provided on another end of the waveguide 2. A microwave that is generated in the microwave supply means 1 passes through the waveguide 2 and a microwave inlet window 3, to be guided into the plasma generation chamber 4. The plasma generation chamber 4 is provided with a discharge gas inlet pipe 5 for introducing a discharge gas such as argon (Ar) gas into the plasma generation chamber 4. Further, a plasma magnetic field generator 6 is provided around the plasma generation chamber 4. A plasma of high density is formed in the plasma generation chamber 4 by the actions of a high-frequency magnetic field formed by the microwave and a magnetic field generated by the plasma magnetic field generator 6.

A cylindrical substrate holder 12 is provided in the vacuum chamber 8. This cylindrical substrate holder 12 is rotatable about a shaft (not shown) which is arranged perpendicularly to wall surfaces of the vacuum chamber 8. A plurality of substrates 13 are mounted on a peripheral surface of the substrate holder 12 at regular intervals. According to this embodiment, 24 nickel (Ni) substrates 13 are mounted on the peripheral surface of the substrate holder 12. A high-frequency power source 10 is connected to the substrate holder 12.

A cylindrical shielding cover 14 of a metal is provided around the substrate holder 12 at a prescribed distance. This shielding cover 14 is connected to a ground electrode. This shielding cover 14 is adapted to prevent discharge across portions of the substrate holder 12 other than those intended for film formation and the vacuum chamber 8 caused by the RF voltage that is applied to the substrate holder 12 in formation of the films. The substrate holder 12 and the shielding cover 14 are so arranged that the distance therebetween is not more than the mean free path of gas molecules. The mean free path of the gas molecules is less than or equal to the mean distance that ions and electrons that are generated by some cause and accelerated by an electric field can travel with no collision. The distance between the substrate holder 12 and the shielding cover 14 is set to be not more than the mean free path of the gas molecules, so as to reduce the probability that ions and electrons will collide with the gas molecules, thereby preventing a chain progression of ionization.

The distance between the substrate holder 12 and the shielding cover 14 is preferably set to be not more than 1/10 of the mean free path of the gas molecules, in particular. According to this embodiment, the distance between the substrate holder and the shielding cover 14 is set at about 5 mm, which is not more than 1/10 of the mean free path of the gas molecules.

Figure 2:
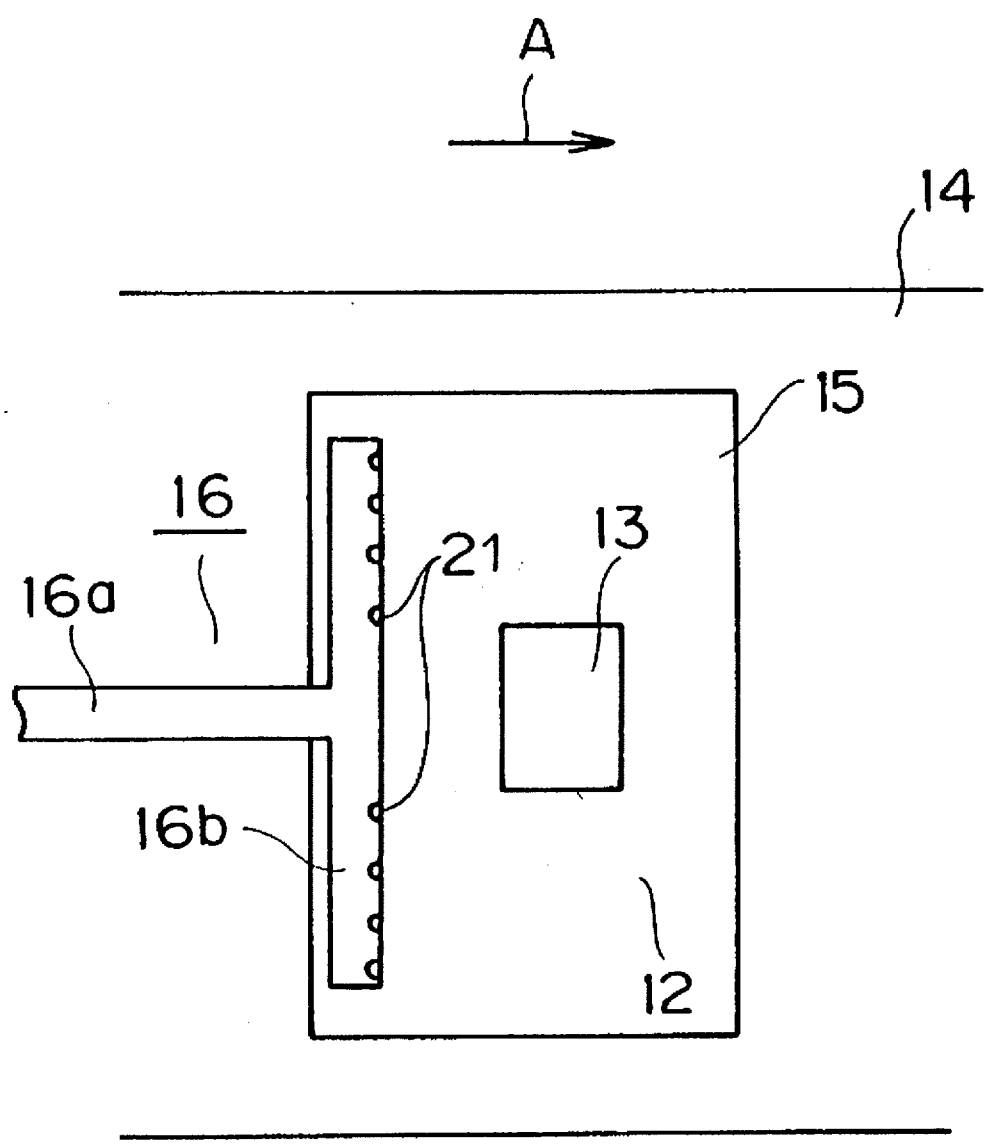
FIG. 2 is a plan view showing a portion around a forward end of a reaction gas inlet pipe provided in the embodiment shown in FIG. 1.

The shielding cover 14 has an opening 15. The plasma is drawn from the plasma generation chamber 4 and passes through the opening 15, to be emitted toward the respective substrate 13 mounted on the substrate holder 12 at a position at the opening 15. The vacuum chamber 8 is provided therein with a reaction gas inlet pipe 16. A forward end of the reaction gas inlet pipe 16 is located above the opening 15. FIG. 2 is a plan view showing a portion around the forward end of the reaction gas inlet pipe 16. Referring to FIG. 2, the reaction gas inlet pipe 16 includes a gas inlet part 16a for introducing $CH_4$ gas into the vacuum chamber 8 from the exterior, and a gas discharge part 16b perpendicularly connected with the gas inlet part 16a. The gas discharge part 16b is arranged perpendicularly to a direction A of rotation of the substrate holder 12, to be positioned upstream of the direction of rotation above the opening 15. The gas discharge part 16b is provided with a plurality of holes 21 which are downwardly directed at an angle of about 45°. According to this embodiment, eight holes 21 are provided at spacing intervals that are gradually made narrower from the center toward both sides. Thus, the $CH_4$ gas which is introduced from the gas inlet part 16a is substantially uniformly discharged from the respective holes 21.

An example for forming diamond-like carbon films serving as hard carbon films on nickel substrates through the apparatus shown in FIG. 1 is now described.

First, 24 Ni substrates 13 were mounted on the peripheral surface of the substrate holder 12 at regular intervals. Then, the vacuum chamber 8 was evacuated to $10^{-5}$ to $10^{-7}$ Torr, and the substrate holder 12 was rotated at a speed of about 10 rpm. Then, Ar gas was supplied from the discharge gas inlet pipe 5 of an ECR plasma generator at $5.7 \times 10^{-4}$ Torr, while a microwave of 2.45 GHz frequency and 100 W power was supplied from the microwave supply means 1, so that an Ar plasma formed in the plasma generation chamber 4 was emitted onto the surface of each substrate 13. At the same time, an RF voltage of 13.56 MHz frequency was applied to the substrate holder 12 from the high-frequency power source 10, so that a self-bias developed in each substrate 13 was −20 V. $CH_4$ gas was supplied from the reaction gas inlet pipe 16 at $1.3 \times 10^{-3}$ Torr. The $CH_4$ gas supplied from the reaction gas inlet pipe 16 was decomposed by an action of the plasma so that carbon entered an ionic or neutral active state having high reactivity to be emitted onto the surface of each substrate 13.

Figure 10:
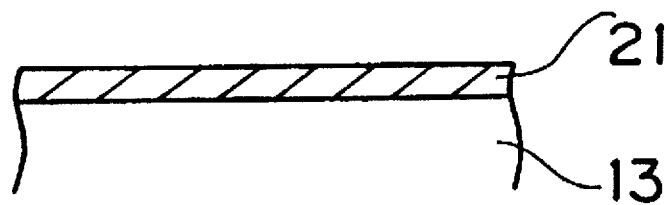
FIG. 10 is a sectional view showing a diamond-like carbon film directly formed on a substrate according to an example of the present invention.

The aforementioned step was carried out for about 15 minutes, to form a diamond-like carbon film of 1200 Å in thickness on the surface of each substrate 13. FIG. 10 is a sectional view showing a diamond-like carbon film formed on each substrate 13 in the aforementioned manner. Referring to FIG. 10, a diamond-like carbon film 21 is formed on the substrate 13.

Figure 3:
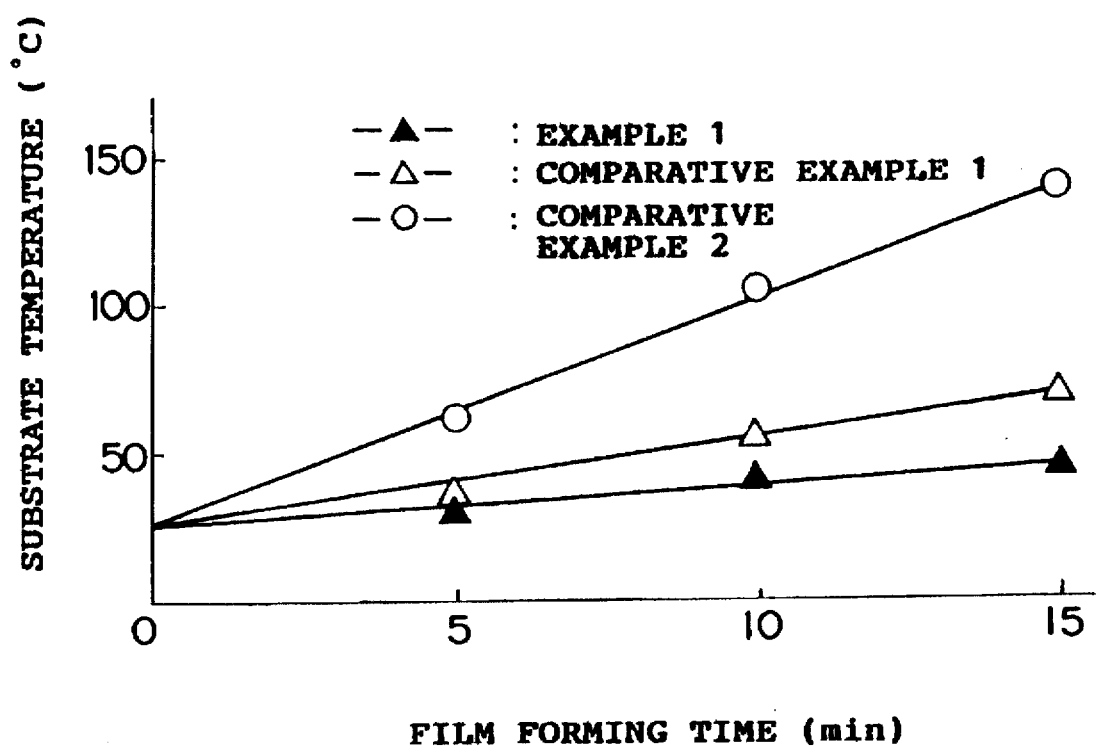
FIG. 3 illustrates the relations between film forming times and substrate temperatures in an example of the present invention and comparative examples.

FIG. 3 illustrates the relation between a film forming time and a substrate temperature in the aforementioned Example (hereinafter referred to as "Example 1"), in comparison to data of a comparative example 1 in which diamond-like carbon films were formed similarly to Example 1 except that the substrate holder was not rotated, and a comparative example 2 in which diamond-like carbon films were formed in an apparatus without a shielding cover and without rotation of a substrate holder. As understood from FIG. 3, the substrate temperature was about 45° C. in Example 1 at a time 15 minutes after starting film formation, while the substrate temperatures at that same point in time in comparative examples 1 and 2 were about 60° C. and about 150° C. respectively. The substrate temperature was extremely increased in comparative example 2, conceivably because discharge was caused between the vacuum chamber and portions of the substrate holder other than those for forming the films. The substrate temperature in comparative example 1 was lower than that in comparative example 2, which shows that it is possible to reduce the substrate temperature by providing the shielding cover. The substrate temperature in Example 1 was lower than that in comparative example 1, conceivably because in Example 1, the portions heated by plasma discharge were successively moved as the substrate holder was rotated, to suppress the increase in substrate temperature. According to the present invention, it is possible to select the type of the substrates without consideration of heat resistance, since the increase of the substrate temperature can be suppressed.

The apparatus shown in FIG. 1 was employed to apply RF voltages to substrates so that self-biases developed in the substrates were −50 V while $CH_4$ gas was supplied from the reaction gas inlet pipe at partial pressures of $3.0 \times 10^{-4}$ Torr, $1.0 \times 10^{-3}$ Torr and $1.3 \times 10^{-3}$ Torr respectively, for investigating the relations between the partial pressures and values of hardness of the resulting diamond-like carbon films as formed.

Figure 13:
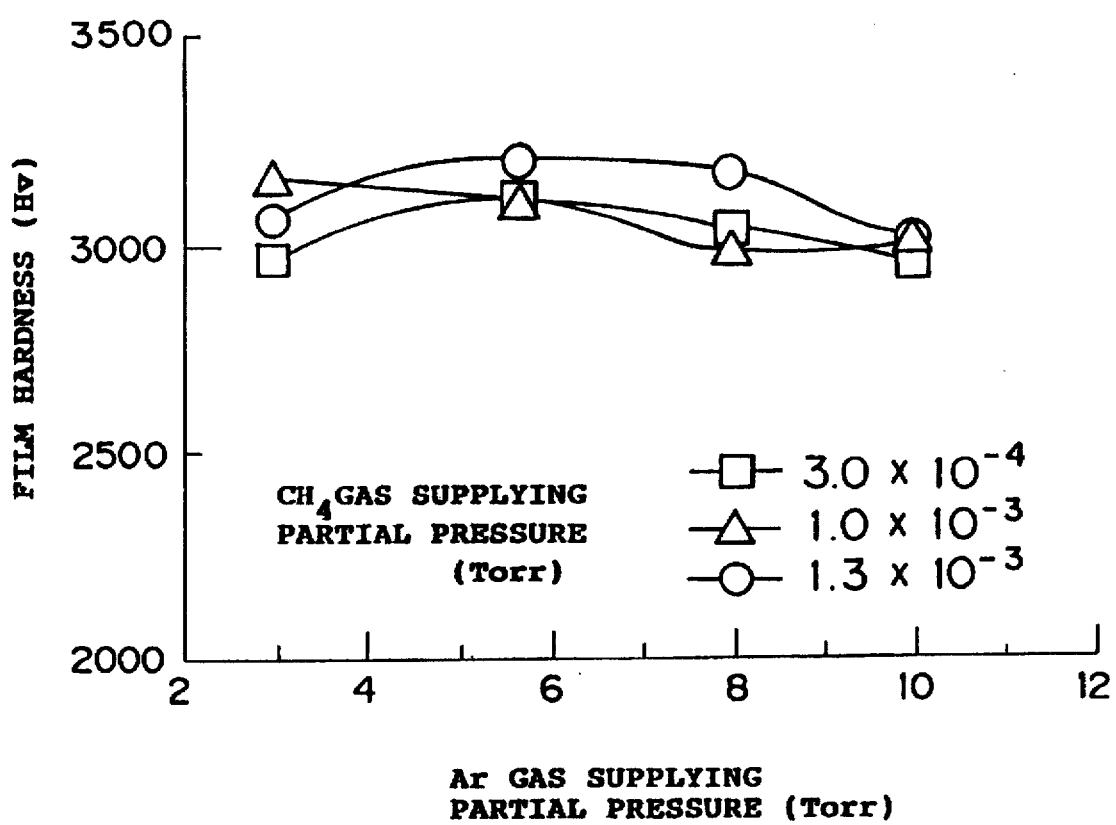
FIG. 13 illustrates the relations between partial pressures for supplying Ar gas and values of film hardness in a method of forming a hard carbon film according to the present invention.

FIG. 13 illustrates the relations between the partial pressures for supplying Ar gas and the values of Vickers hardness of the films, which were measured on the basis of JIS G0202.

As shown in FIG. 13, the values of hardness of the films were about 3000 Hv regardless of the partial pressures for supplying Ar gas. Further, substantially similar results were obtained also when the partial pressures for supplying $CH_4$ gas were changed. Thus, it is understood to be possible to form diamond-like carbon films having prescribed values of film hardness on substrates regardless of the partial pressures for supplying Ar gas and $CH_4$ gas.

Figure 14:
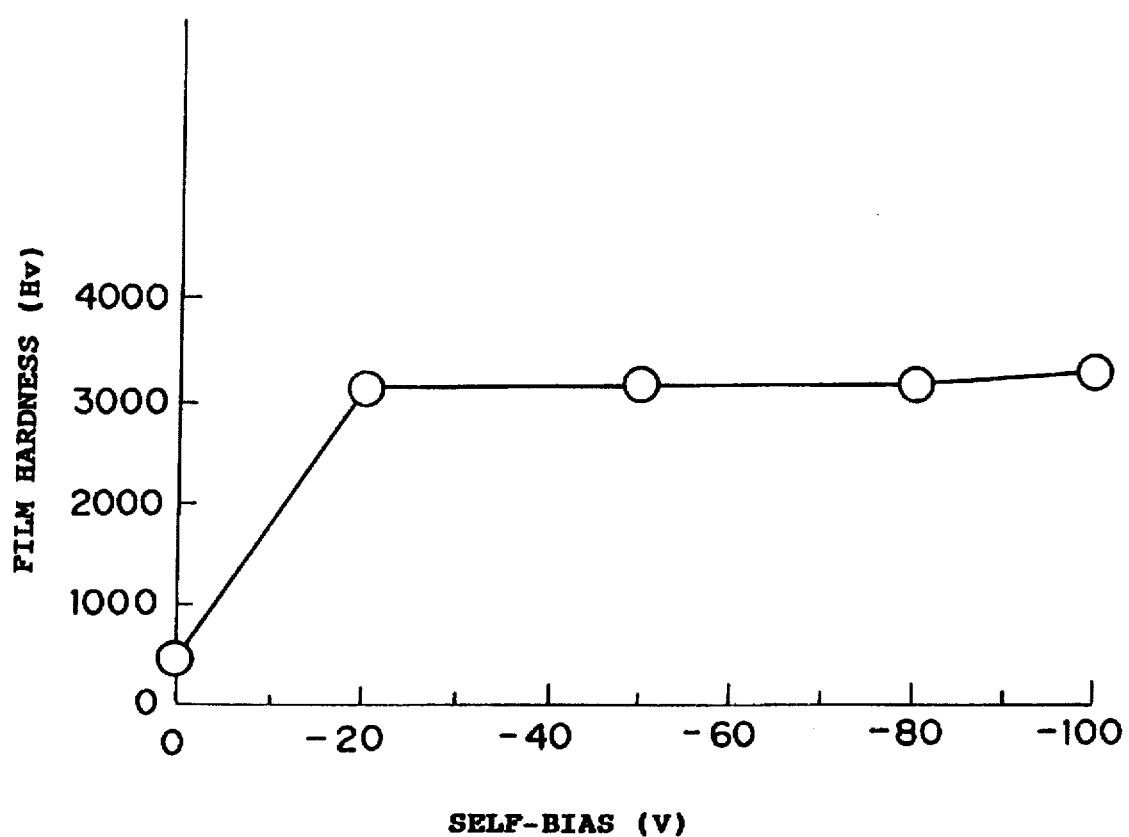
FIG. 14 illustrates the relation between a self-bias developed in a substrate and film hardness in the method of forming a hard carbon film according to the present invention.

Then, the Ar gas and the $CH_4$ gas were supplied at partial pressures of $5.7 \times 10^{-4}$ Torr and $1.0 \times 10^{-3}$ Torr respectively, while the output from the high-frequency power source was changed to vary the self-biases developed in the substrates. FIG. 14 illustrates the relation between the self-bias developed in each substrate and film hardness of the diamond-like carbon film as formed.

As shown in FIG. 14, the film hardness was at a low value of about 500 Hv when the self-bias developed in each substrate was 0 V. The film hardness increased correspondingly with the absolute value of the self-bias voltage as it varied through the range of 0 V to −20 V. The film hardness was at a high value of about 3000 Hv when the self-bias was −20 V. This film hardness of about 3000 Hv substantially remained unchanged when the self-bias was reduced below −20 V. Thus, it is understood that it is possible to form diamond-like carbon films of about 3000 Hv in hardness on substrates by setting the RF voltage of the high-frequency power source so that the self-bias developed in each substrate is not more than −20 V, regardless of the partial pressures for supplying Ar gas and $CH_4$ gas.

A result similar to that shown in FIG. 14 was obtained also when the partial pressures for supplying Ar gas and $CH_4$ gas were varied in a range of $1.0 \times 10^{-4}$ to $20.0 \times 10^{-4}$ Torr.

Another embodiment, for forming intermediate layers on substrates and then forming diamond-like carbon films serving as hard carbon films on the intermediate layers, will now be described.

Figure 11:
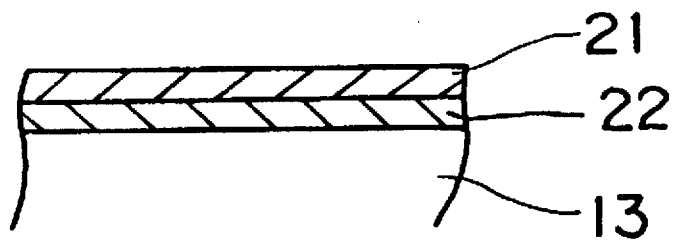
FIG. 11 is a sectional view showing an intermediate layer formed on a substrate and a diamond-like carbon film formed thereon according to another example of the present invention.
Figure 12:
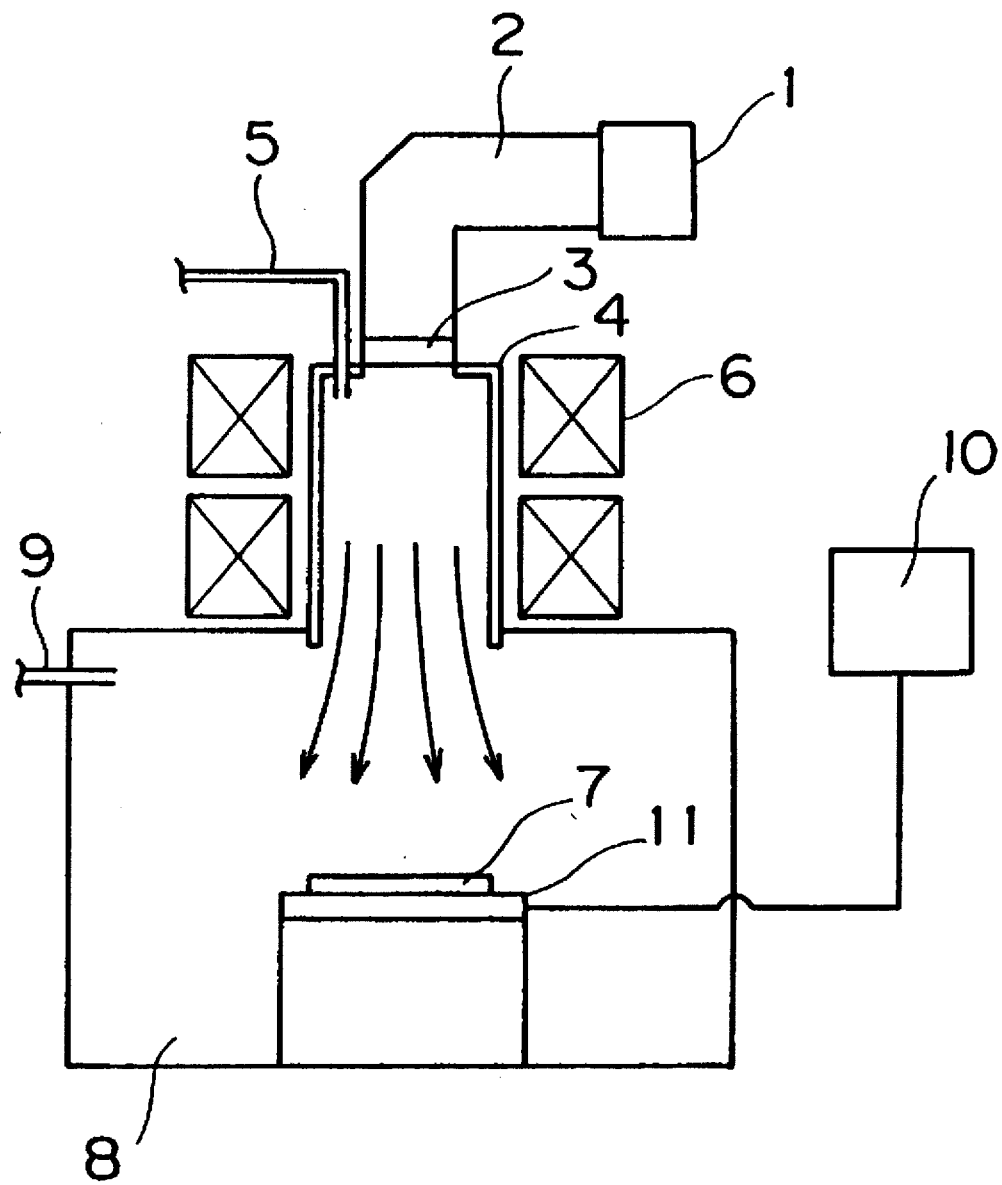
FIG. 12 is a schematic sectional view showing a conventional hard carbon film forming apparatus.

FIG. 11 is a sectional view showing an intermediate layer 22 formed on a substrate 13, and a hard carbon film 21 formed on this intermediate layer 22.

Figure 4:
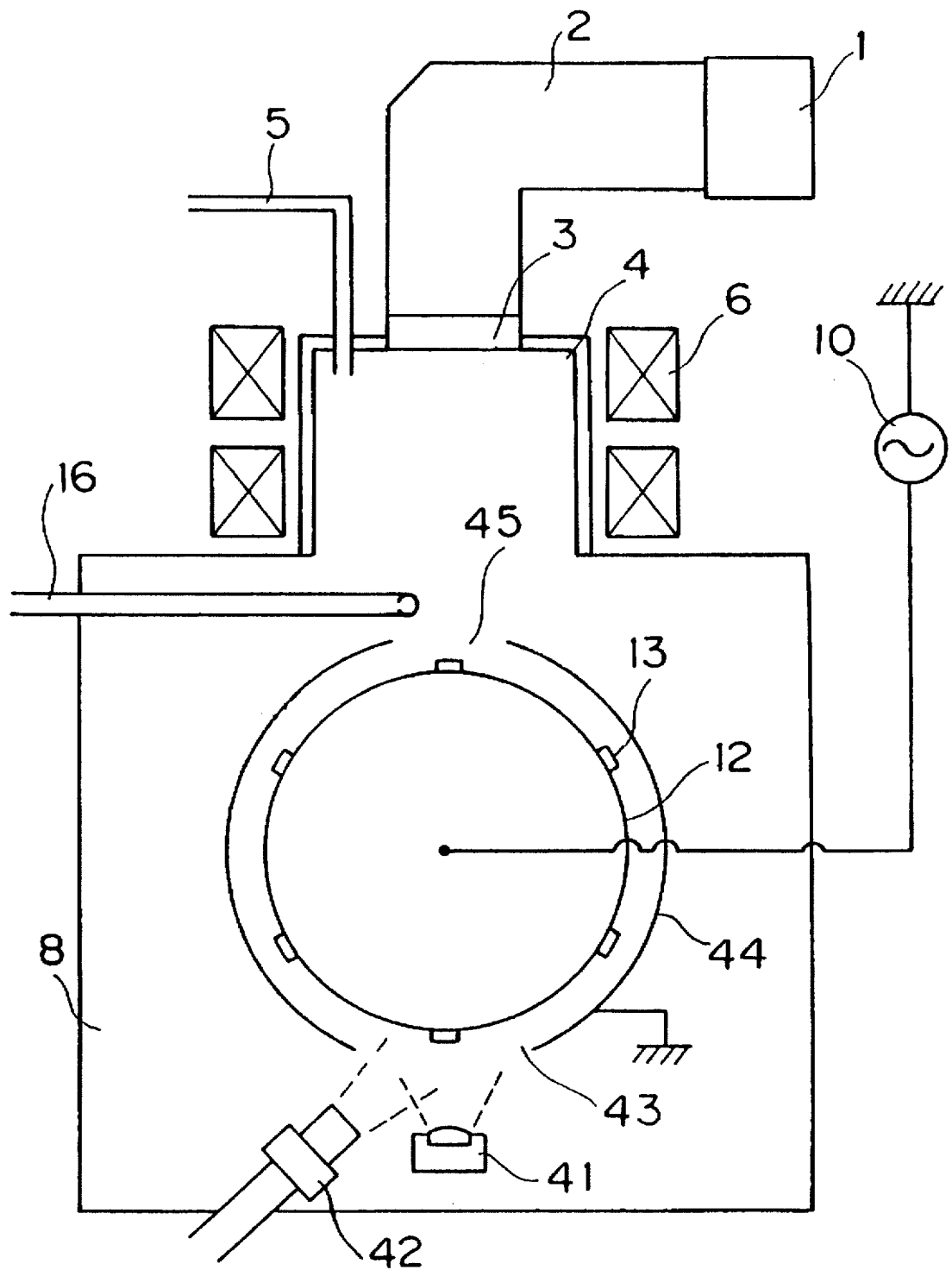
FIG. 4 is a schematic sectional view showing a hard carbon film forming apparatus in an embodiment according to the seventh aspect of the present invention.

FIG. 4 is a schematic sectional view showing a hard carbon film forming apparatus according to this embodiment of the present invention. Referring to FIG. 4, a shielding cover 44 is provided around a substrate holder 12 which is arranged in a vacuum chamber 8. This shielding cover 44 is provided with first and second openings 45 and 43. According to this embodiment, the first and second openings 45 and 43 are formed in substantially opposite positions. The first opening 45 is formed similarly to the opening 15 shown in FIG. 1, so that a forward end of a reaction gas inlet pipe 16 is located above the first opening 45, similarly to the apparatus shown in FIG. 1.

An evaporation source 41 is provided under the second opening 43, for evaporating material atoms for forming intermediate layers by an electron beam and emitting the same toward substrates 13. An ion gun 42 is provided in the vicinity of the evaporation source 41, for emitting ions of an inert gas for supplying the material atoms evaporated from the evaporation source 41 with energy. According to this embodiment, the inert gas is Ar gas, and the intermediate layer forming means comprise the evaporation source 41 and the ion gun 42. The evaporation source 41 and the ion gun 42 emit the material atoms for forming intermediate layers onto the substrates 13 through the second opening 43.

Other structures of this embodiment are similar to those of the embodiment shown in FIG. 1. Thus, elements corresponding to those in FIG. 1 are denoted by the same reference numerals, and a redundant description thereof is omitted.

Another inventive example will now be described, namely an example for forming intermediate layers from a single element, and then forming diamond-like carbon films on the intermediate layers.

Similarly to the above described Example 1, 24 Ni substrates 13 were mounted on a peripheral surface of the substrate holder 12 at regular intervals. The vacuum chamber 8 was evacuated to $10^{-5}$ to $10^{-7}$ Torr, and the substrate holder 12 was rotated at a speed of about 10 rpm. Then, the ion gun 42 was supplied with Ar gas, so that Ar ions were ejected and emitted onto the surface of each substrate 13. At this time, the Ar ions were set at an acceleration voltage of 400 eV and ion current density of 0.3 mA/cm$^2$. Simultaneously with the emission of the Ar ions, the evaporation source 41 was driven to evaporate Ru atoms, for emitting the same onto the surface of each substrate 13. The Ru evaporation rate was set to be 420 Å/min. in terms of a film forming rate on each substrate 13.

The aforementioned step was carried out for about 5 minutes, to form an intermediate layer of Ru having a thickness of 200 Å on the surface of each substrate 13.

Then, the emission of Ru atoms from the evaporation source 41 and the emission of Ar ions from the ion gun 42 were stopped, and thereafter Ar gas was supplied from a discharge gas inlet pipe 5 of an ECR plasma generator at 5.7×10$^{-4}$ Torr while a microwave of 2.45 GHz frequency and 100 W power was supplied from microwave supply means 1, to emit an Ar plasma formed in a plasma generation chamber 4 onto the surface of each substrate 13. At the same time, an RF voltage of 13.56 MHz frequency was applied from a high-frequency power source 10 to the substrate holder 12 and CH$_4$ was supplied from a reaction gas inlet pipe 16 at 1.3×10$^{-3}$ Torr, so that a self-bias of −20 V developed in each substrate 13.

The aforementioned step was carried out for about 15 minutes, to form a diamond-like carbon film of 1200 Å in thickness on the intermediate layer that had been formed on each substrate 13.

As a result of the aforementioned two steps, a layered thin film including the intermediate layer 22 of Ru formed on the surface of each substrate 13 and the diamond-like carbon film 21 formed on the intermediate layer 22, was obtained as shown in FIG. 11.

Due to such formation of the intermediate layer 22, it is possible to relax stress in the diamond-like carbon film 21, thereby improving the adhesion between the substrate 13 and the diamond-like carbon film 21. The stress in the diamond-like carbon film 21 can be relaxed conceivably because it is possible to relax thermal stress caused by a difference in thermal expansion coefficients between the substrate 13 and the diamond-like carbon film 21, due to the presence of the intermediate layer 22.

Another inventive example will now be described, namely an example for forming mixed layers of material atoms and carbon as intermediate layers and then forming diamond-like carbon films thereon. In this example, an apparatus similar to that shown in FIG. 4 was employed.

Similarly to the above described Example 1, 24 Ni substrates 13 were mounted on the peripheral surface of the substrate holder 12 at regular intervals. The vacuum chamber 8 was evacuated to $10^{-5}$ to $10^{-7}$ Torr, and the substrate holder 12 was rotated at a speed of about 10 rpm.

Figure 5:
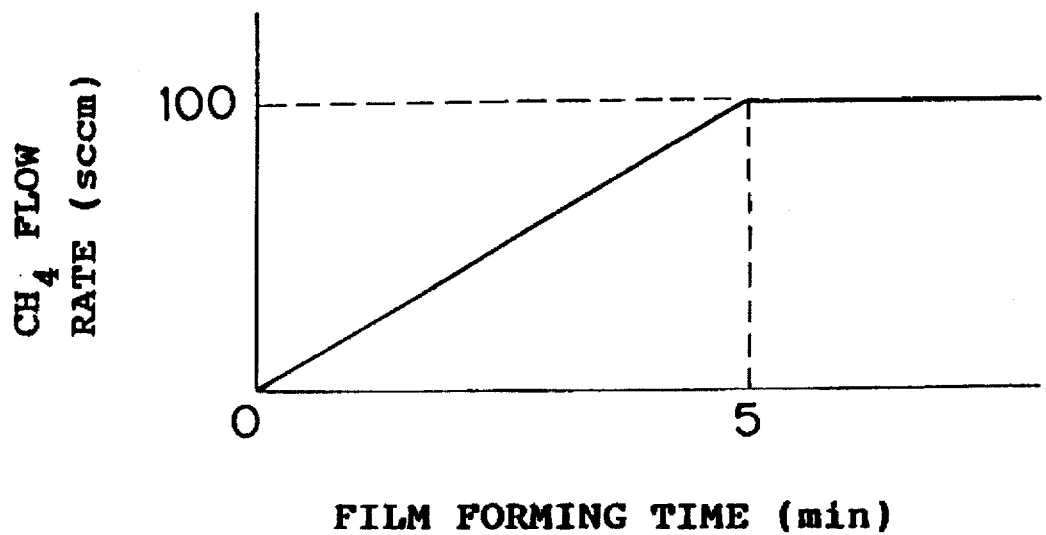
FIG. 5 illustrates the relation between a film forming time and a $CH_4$ flow rate in the formation of an intermediate layer having a graded structure with the apparatus of the embodiment according to the seventh aspect of the present invention.

Then, Ar gas was supplied from the discharge gas inlet pipe 5 of the ECR plasma generator at 5.7×10$^{-4}$ Torr, while a microwave of 2.45 GHz frequency and 100 W power was supplied from the microwave supply means 1 to emit an Ar plasma formed in the plasma generation chamber 4 onto the surface of each sub-strate 13. At the same time, an RF voltage of 13.56 MHz frequency was applied to the substrate holder 12 from the high-frequency power source 10 while CH$_4$ gas was supplied from the reaction gas inlet pipe 16, so that a self-bias of −20 V was developed in each substrate 13. The supply quantity of the CH$_4$ gas was gradually increased with time as shown in FIG. 5, to be 100 sccm, i.e., 1.3×10−3 Torr, after a lapse of 5 minutes.

Figure 6:
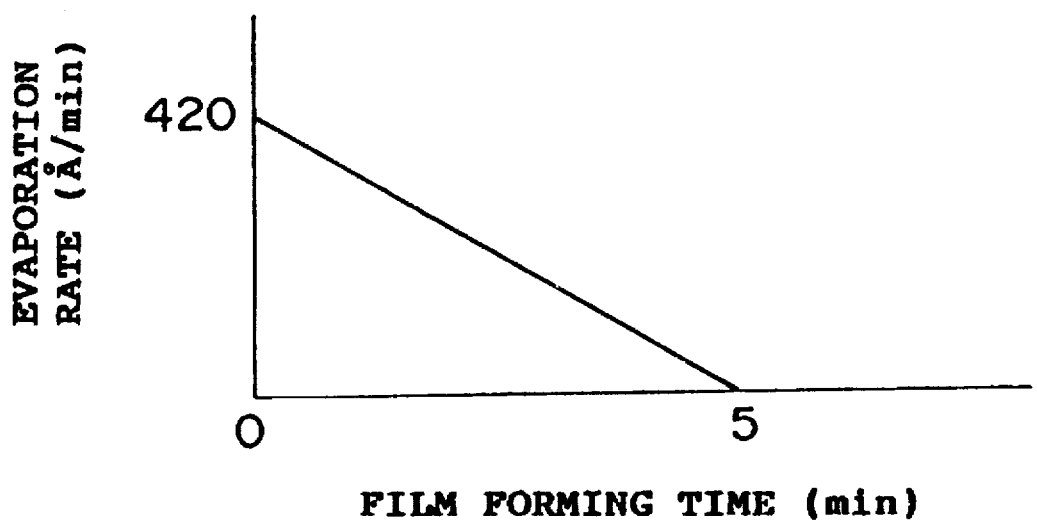
FIG. 6 illustrates the relation between the film forming time and an evaporation rate in the formation of the intermediate layer having a graded structure with the apparatus of the embodiment according to the seventh aspect of the present invention.

Simultaneously with the aforementioned film formation by the ECR plasma generator, Ar ions were emitted from the ion gun 42 and Ru atoms were emitted from the evaporation source 41 to the surface of each substrate 13. At this time, the Ar ions were set at an acceleration voltage of 400 eV and ion current density of 0.3 mA/cm$^2$. Further, the Ru evaporation rate was gradually reduced with time from 420 Å/min. in terms of a film forming rate on each substrate 13 to reach 0 Å/min. after a lapse of 5 minutes, as shown in FIG. 6. The emission of the Ar ions from the ion gun 42 was stopped when the Ru evaporation rate reached 0 Å/min., i.e., after a lapse of 5 minutes.

As hereinabove described, carbon film formation by plasma CVD and Ru evaporation were simultaneously carried out in the first and second openings 45 and 43 respectively, to form an intermediate layer containing Ru and C in a mixed state. According to this Example, the aforementioned step was carried out for about 5 minutes, to form a mixed layer of Ru and C having a total thickness of 200 Å on the surface of each substrate 13. As shown in FIGS. 5 and 6, the evaporation volume of Ru was reduced and the amount of carbon film formation was increased with time. Thus, the intermediate layer had a graded structure or composition gradient such that the Ru content was gradually reduced and the C content was gradually increased as the distance from the surface of each substrate 13, increased.

Then, a diamond-like carbon film was formed on each intermediate layer. CH$_4$ gas was supplied from the reaction gas inlet pipe 16 at a constant partial pressure of 1.3×10$^{-3}$ Torr, to continuously carry out film formation by the ECR plasma generator in the aforementioned step. This step was carried out for about 15 minutes, to form a diamond-like carbon film of 1200 Å in thickness on the intermediate layer that had been formed on each substrate 13.

As a result, a layered film including an intermediate layer consisting of Ru and C having a graded structure and a diamond-like carbon film was formed on each substrate 13. Such an intermediate layer having a graded structure can further improve the adhesion between the substrate and the diamond-like carbon film as compared with the aforementioned intermediate layer consisting of a single element.

An evaluation test was conducted to evaluate the adhesion of diamond-like carbon films formed by the apparatus of the aforementioned embodiment. Samples were prepared by directly forming diamond-like carbon films on Ni substrates (Example 1), by forming intermediate layers consisting of Ru on Ni substrates and then forming diamond-like carbon films on the intermediate layers (Example 2), by forming intermediate layers of mixed layers consisting of Ru and C on Ni substrates and then forming diamond-like carbon films on the intermediate layers (Example 3), and by employing an Si evaporation source for forming intermediate layers consisting of Si on Ni substrates and then forming diamond-like carbon films on the intermediate layers (Example 4). Adhesion was evaluated by an indentation test with constant loads (1 kg) employing Vickers indenters. 50 samples were prepared for each Example, and the numbers of those causing separation of the diamond-like carbon films formed on the Ni substrates were counted. Table 1 shows the results.

TABLE 1

|  | Example 1 | Example 2 | Example 3 | Example 4 |
|---|---|---|---|---|
| Number of Samples Causing Separation | 43 | 7 | 0 | 16 |

As obvious from Table 1, the numbers of samples causing separation were reduced in Examples 2, 3 and 4, which were provided with the intermediate layers, as compared with Example 1, which was not provided with an intermediate layer. Thus, it is understood that it is possible to improve the adhesion of the diamond-like carbon films by providing the intermediate layers. Particularly from Example 3, it is clearly understood that it is possible to remarkably improve the adhesion of the diamond-like carbon films by forming the intermediate layers of Ru and C having graded structures.

Comparing Examples 2 and 4 with each other, it is understood that Ru is superior to Si as material atoms for forming intermediate layers with respect to Ni substrates.

Figure 7:
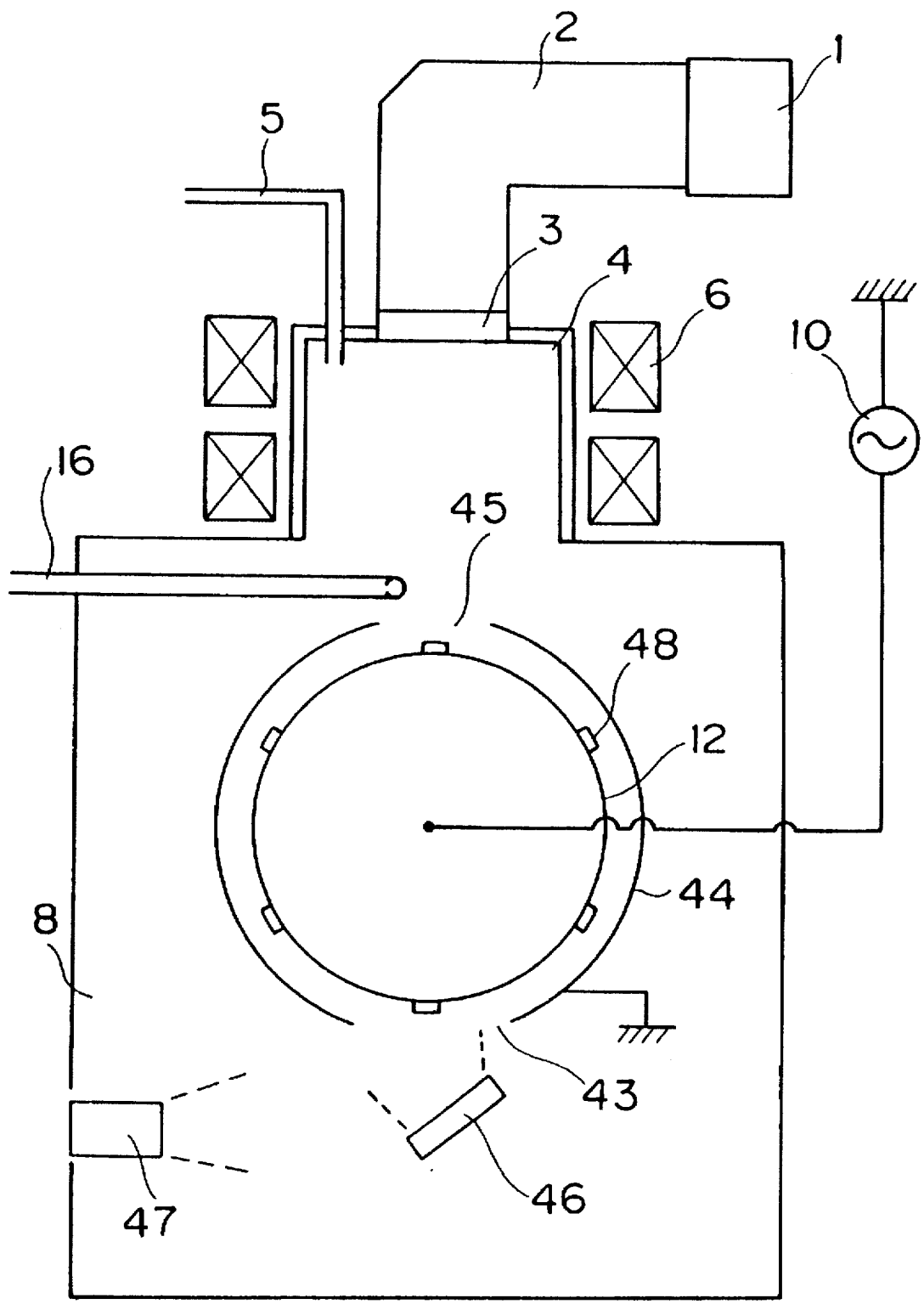
FIG. 7 is a schematic sectional view showing a hard carbon film forming apparatus in an embodiment according to the eighth aspect of the present invention.

FIG. 7 is a schematic sectional view showing a hard carbon film forming apparatus according to still another embodiment of the present invention. Referring to FIG. 7, a shielding cover 44 is provided around a substrate holder 12 which is arranged in a vacuum chamber 8. The shielding cover 44 has a first opening 45 similar to the opening 15 shown in FIG. 1, so that a forward end of a reaction gas inlet pipe 16 is located above the first opening 45, similarly to the apparatus shown in FIG. 1.

A target 46 of material atoms for forming intermediate layers is provided under a second opening 43 of the shielding cover 44. Further, an ion gun 47 is provided in the vicinity of the target 46, for emitting ions of an inert gas to the target 46 thereby sputtering the target 46. According to this embodiment, the inert gas is Ar gas and the intermediate layer forming means comprises the target 46 and the ion gun 47, while thin-film heads 48 are mounted on the substrate holder 12 as substrates. The target 46 and the ion gun 47 emit the material atoms for forming intermediate layers onto the thin-film heads 48 through the second opening 43.

The ions from the ion gun 47 are applied not only to the target 46 but also to the thin-film head 48.

Other structures of this embodiment are similar to those of the embodiment shown in FIG. 1. Thus, elements corresponding to those in FIG. 1 are denoted by the same reference numerals, and a redundant description is omitted.

A further inventive example will now be described, namely an example for forming intermediate layers from a single element, and then forming diamond-like carbon films thereon.

Similarly to the above described Example 1, 24 thin-film heads 48 were mounted on a peripheral surface of the substrate holder 12 at regular intervals. The vacuum chamber 8 was evacuated to $10^{-5}$ to $10^{-7}$ Torr, and the substrate holder 12 was rotated at a speed of about 10 rpm. Then, Ar gas was supplied to the ion gun 47, so that Ar ions were ejected and emitted onto a surface of the target 46 consisting of Si. At this time, the Ar ions were set at an acceleration voltage of 900 eV and ion current density of 0.3 mA/cm$^2$.

The aforementioned step was carried out for about 2 minutes, to form an intermediate layer of Si having a thickness of 60 Å on the surface of each thin-film head 48.

Then, the emission of the Ar ions from the ion gun 47 was stopped and Ar gas was supplied from a discharge gas inlet pipe 5 of an ECR plasma generator at $5.7 \times 10^{-4}$ Torr, while a microwave of 2.45 GHz frequency and 100 W power was supplied from microwave supply means 1, to emit an Ar plasma formed in a plasma generation chamber 4 onto the surface of each thin-film head 48. At the same time, an RF voltage of 13.56 MHz frequency was applied to the substrate holder 12 from a high-frequency power source 10 and CH$_4$ gas was supplied from a reaction gas inlet pipe 16 at $1.3 \times 10^{-3}$ Torr, so that a self-bias of $-20$ V was developed in each thin-film head 48.

The aforementioned step was carried out for about 2.5 minutes, to form a diamond-like carbon film of 200 Å in thickness on the intermediate layer that had been formed on each thin-film head 48.

As a result of the aforementioned two steps, a layered thin film was formed on the surface of each thin-film head 48, including the intermediate layer of Si and the diamond-like carbon film formed thereon. Due to such formation of an intermediate layer, it is possible to relax stress in a diamond-like carbon film, thereby improving the adhesion between a substrate and the diamond-like carbon film. The stress in the diamond-like carbon film can be relaxed conceivably because it is possible to relax the thermal stress caused by the difference in thermal expansion coefficients between the substrate and the diamond-like carbon film, due to the presence of the intermediate layer. Further, the intermediate layer is formed with higher adhesion since the Ar ions are applied not only to the target but also to each thin-film head during formation of the intermediate layer.

Another inventive example will now be described, namely an example for forming mixed layers of material atoms and carbon as intermediate layers and forming diamond-like carbon films thereon. Also in this example, an apparatus similar to that shown in FIG. 7 was employed.

First, 24 thin-film heads 48 were mounted on the peripheral surface of the substrate holder 12 at regular intervals. The vacuum chamber 8 was evacuated to $10^{-5}$ to $10^{-7}$ Torr, and the substrate holder 12 was rotated at a speed of about 10 rpm.

Figure 8:
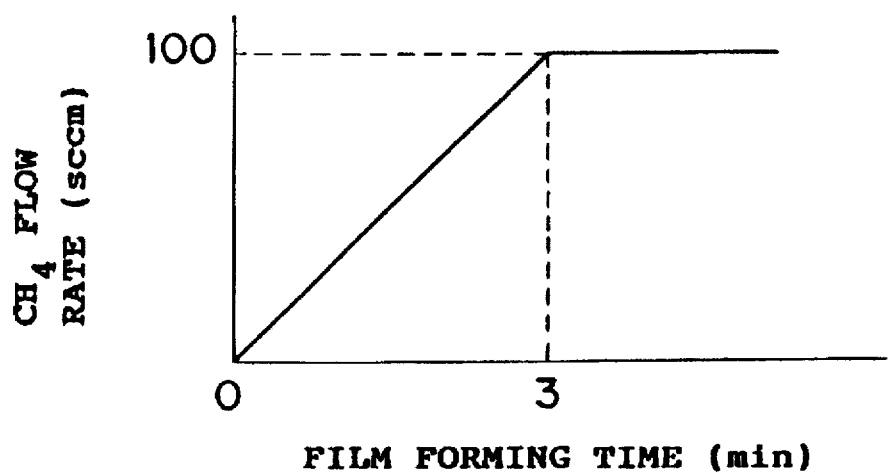
FIG. 8 illustrates the relation between a film forming time and a $CH_4$ flow rate in the formation of an intermediate layer having a graded structure with the apparatus of the embodiment according to the eighth aspect of the present invention.

Then, Ar gas was supplied from the discharge gas inlet pipe 5 of the ECR plasma generator at $5.7 \times 10^{-4}$ Torr while a microwave of 2.45 GHz frequency and 100 W power was supplied from the microwave supply means 1, to emit an Ar plasma formed in the plasma generation chamber 4 to the surface of each thin-film head 48. At the same time, an RF voltage of 13.56 MHz frequency was applied from the high-frequency power source 10 to the substrate holder 12 and CH$_4$ gas was supplied from the reaction gas inlet pipe 16, so that a self-bias of $-20$ V was developed in each thin-film head 48. At this time, the supply quantity of the CH$_4$ gas was gradually increased with time to reach 100 sccm, i.e., $1.3 \times 10^{-}$Torr, after a lapse of 3 minutes, as shown in FIG. 8.

Simultaneously, with the film formation by the ECR plasma generator, Ar ions were emitted onto the surface of the target 46 from the ion gun 47. At this time, the Ar ions were set at an acceleration voltage of 900 eV and ion current density of 0.3 mA/cm$^2$.

Figure 9:
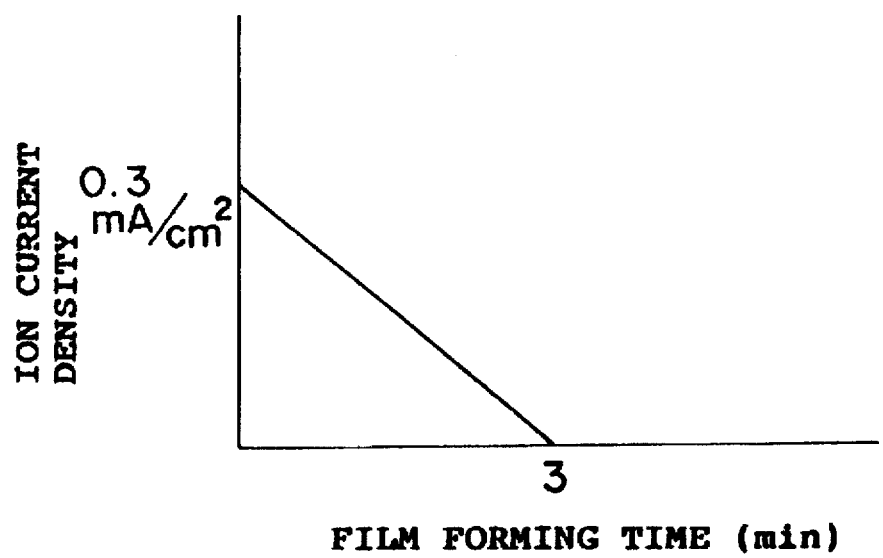
FIG. 9 illustrates the relation between the film forming time and an ion current density in the formation of the intermediate layer having a graded structure with the apparatus of the embodiment according to the eighth aspect of the present invention.

The ion current density was gradually reduced with time to reach 0 mA/cm$^2$ after a lapse of 3 minutes, as shown in FIG. 9.

As hereinabove described, carbon film formation by plasma CVD and Si sputtering were simultaneously carried out in the first and second openings 45 and 43 respectively, to form a mixed layer of Si and C as an intermediate layer. According to this embodiment, the aforementioned step was carried out for about 3 minutes, to form a mixed layer of Si and C having a total thickness of 60 Å on the surface of each thin-film head 48. As shown in FIGS. 8 and 9, the quantity of Si was reduced and the amount of carbon film formation was increased over time. Thus, this intermediate layer had a graded structure or composition gradient such that the Si content was gradually reduced and the C content was gradually increased as the distance from the surface of each thin-film head 48 increased.

Then, a diamond-like carbon film was formed on each intermediate layer. CH$_4$ gas was supplied from the reaction gas inlet pipe 16 at a constant partial pressure of 1.3×10$^{-3}$ Torr, to continuously carry out film formation by the ECR plasma generator in the aforementioned step. This step was carried out for about 2.5 minutes, to form a diamond-like carbon film of 200 Å in thickness on the intermediate layer of each thin-film head 48.

As a result, a layered film including the intermediate layer of Si and C having a graded structure and the diamond-like carbon film was formed on each substrate. Such an intermediate layer having a graded composition or structure can further improve the adhesion between the substrate and the diamond-like carbon film as compared with the aforementioned intermediate layer consisting of a single element.

A further inventive example will now be described, namely an example for forming intermediate layers mainly composed of Si on Ni substrates and then forming diamond-like carbon films on the intermediate layers according to the second aspect of the present invention through the apparatus shown in FIG. 7.

The vacuum chamber 8 was evacuated to 10$^{-5}$ to 10$^{-7}$ Torr, and the substrate holder 12 was rotated at a speed of about 10 rpm. 24 Ni substrates were mounted on the substrate holder 12 at regular intervals. The ion gun 47 was supplied with Ar gas, to emit Ar ions onto the surface of the target 46. At this time, the Ar ions were set at an acceleration voltage of 900 eV and ion current density of 0.3 mA/cm$^2$, while the sputtered Si was evaporated on each substrate at an evaporation rate of 30 Å/min.

The time for the Si sputtering step was changed to vary the thicknesses of the Si intermediate layers formed on the Ni substrates to 30 Å, 50 Å, 100 Å and 500 Å (Example 5).

Diamond-like carbon films of 1200 Å in thickness were formed similarly to Example 1 on the intermediate layers having different thicknesses, which were obtained in the aforementioned manner.

An evaluation test for adhesion was carried out on the diamond-like carbon films obtained in the aforementioned manner. The adhesion evaluation test was carried out similarly to that for Examples 1 to 4 described above.

Table 2 shows the results.

TABLE 2

|  | Example 1 | Example 5 | | | |
|---|---|---|---|---|---|
|  |  | 30Å | 50Å | 100Å | 500Å |
| Number of Samples Causing Separation | 43 | 16 | 0 | 0 | 0 |

As clearly understood from Table 2, the diamond-like carbon films were generally separated when the intermediate layers were less than 50 Å in thickness, while no such separation was recognized when the film thicknesses exceeded 50 Å.

It is conceivable that a sufficient range for the thickness of the intermediate layer is up to about 5000 Å when the hard-carbon-film-coated substrate according to the present invention is applied to an outer blade of an electric shaver. The adhesion is not further improved even if the thickness exceeds 5000 Å. Therefore, it is conceivable that a thickness of about 4000 Å is sufficient for an intermediate layer that is mainly composed of Si in the present invention. It is also conceivable that a thickness of about 5000 Å is sufficient for the diamond-like carbon film. If the thickness of the diamond-like carbon film exceeds 5000 Å, then internal stress could easily be caused and deform the substrate as a result.

Another inventive example will now be described, namely an example for forming mixed layers of Si and carbon as intermediate layers.

Mixed layers of Si and carbon were formed similarly to the aforementioned Example for forming mixed layers of Si and C as intermediate layers. Samples were prepared by varying the thicknesses of the intermediate layers to 30 Å, 50 Å, 100 Å and 500 Å (Example 6). Further, diamond-like carbon films were formed on the intermediate layers to a thickness of 1200 Å. Adhesion of the diamond-like carbon films was evaluated in the samples obtained in the aforementioned manner, similarly to the above.

Table 3 shows the results.

TABLE 3

|  | Example 1 | Example 6 | | | |
|---|---|---|---|---|---|
|  |  | 30Å | 50Å | 100Å | 500Å |
| Number of Samples Causing Separation | 43 | 14 | 0 | 0 | 0 |

As clearly understood from Table 3, the diamond-like carbon films were generally separated when the intermediate layers of SiC were less than 50 Å in thickness, while no such separation was recognized when the film thicknesses exceeded 50 Å. Thus, the intermediate layer is preferably at least 50 Å in thickness, also when the intermediate layer is prepared from SiC.

Then, nitrogen gas was introduced as a reaction gas containing nitrogen from the gas inlet pipe 16 shown in FIG. 7 into the vacuum chamber 8, to form mixed layers of Si and nitrogen as intermediate layers. The nitrogen gas was supplied at a partial pressure of 1.8×10$^{-4}$ Torr. Diamond-like carbon films were formed on the intermediate layers, under conditions similar to those in Example 6. Consequently, results similar to those shown in Table 3 were obtained.

Further, mixed layers of Si and oxygen were formed as intermediate layers, and then diamond-like carbon films were formed on these intermediate layers. A reaction gas containing oxygen was prepared from oxygen gas, and supplied at a partial pressure of $1.8 \times 10^{-4}$ Torr. Diamond-like carbon films were formed on the intermediate layers, under conditions similar to those in Example 6. Consequently, results similar to those shown in Table 3 were obtained.

Further, Ge was employed in place of Si as an intermediate layer. The evaluation of adhesion was performed similarly to Examples 5 and 6. Consequently, results similar to those shown in Tables 2 and 3 were obtained.

An example according to the third aspect of the present invention will now be described. According to this example, carbon thin films were formed as intermediate layers. An apparatus similar to that shown in FIG. 7 was employed for forming the carbon thin films, with a carbon target. Ar ions were set at an acceleration voltage of 900 eV and ion current density of 0.3 mA/cm$^2$. The times for forming the carbon thin films were changed to vary the thicknesses of the carbon thin films serving as intermediate layers to 30 Å, 50 Å, 100 Å and 500 Å (Example 7). Diamond-like carbon films were formed on the intermediate layers having different thicknesses obtained in the aforementioned manner, similarly to the above Example 5, and then were subjected to an adhesion evaluation test. Table 4 shows the results.

TABLE 4

|  | Example 1 | Example 7 | | | |
| --- | --- | --- | --- | --- | --- |
|  |  | 30Å | 50Å | 100Å | 500Å |
| Number of Samples Causing Separation | 43 | 15 | 0 | 0 | 0 |

As clearly understood from Table 4, the diamond-like carbon films were generally separated when the intermediate layers were less than 50 Å in thickness, while no such separation was recognized when the film thicknesses exceeded 50 Å. Thus, the intermediate layer is preferably at least 50 Å in thickness, also when the layer is formed by a carbon thin film. Further, the intermediate layer is preferably not more than 4000 Å in thickness when the hard-carbon-film-coated substrate is used for an outer blade of an electric shaver, while it is preferably not more than 8000 Å in thickness when the hard-carbon-film-coated substrate is used for an inner blade, for reasons similar to those discussed above regarding the example according to the second aspect of the present invention.

In the present invention, an intermediate layer may be formed by plasma CVD. In this case, a gas containing material atoms for forming an intermediate layer is supplied into a vacuum chamber 8 from a reaction gas inlet pipe 16 to form a plasma and emit the plasma toward a substrate thereby forming the intermediate layer on the substrate.

While each of the above embodiments and examples has been described with reference to an ECR plasma generator serving as plasma generation means, the present invention is not restricted to this but another plasma CVD apparatus such as a high-frequency plasma CVD apparatus or a DC plasma CVD apparatus is also employable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A hard-carbon-film-coated substrate comprising:

a substrate consisting of a metal or an alloy at least mainly composed of Ni or Al, or stainless steel;

an intermediate layer at least mainly composed of Ru arranged on said substrate; and a predominantly amorphous hard carbon film arranged on said intermediate layer.

2. The hard-carbon-film-coated substrate in accordance with claim 1, wherein said hard carbon film is a diamond-like carbon film.

3. The hard-carbon-film-coated substrate in accordance with claim 1, wherein said hard carbon film has a Vickers hardness of about 3000.

4. The hard-carbon-film-coated substrate in accordance with claim 1, wherein said intermediate layer provides an improved adhesion of said hard carbon film through said intermediate layer onto said substrate as compared to an adhesion of said hard carbon film directly onto said substrate.

5. The hard-carbon-film-coated substrate in accordance with claim 1, wherein said intermediate layer essentially consists of Ru.

6. A hard-carbon-film-coated substrate comprising:

a substrate consisting of a metal or an alloy at least mainly composed of Ni or Al, or stainless steel;

an intermediate layer at least mainly composed of Si arranged directly on and in contact with said substrate; and a predominantly amorphous hard carbon film arranged on said intermediate layer.

7. A hard-carbon-film-coated substrate in accordance with claim 6, wherein said intermediate layer has a thickness of 50 to 8000 Å.

8. A hard-carbon-film-coated substrate in accordance with claim 6, wherein said intermediate layer has a thickness of 50 to 4000 Å.

9. The hard-carbon-film-coated substrate in accordance with claim 6, wherein said hard carbon film is a diamond-like carbon film.

10. The hard-carbon-film-coated substrate in accordance with claim 6, wherein said hard carbon film has a Vickers hardness of about 3000.

11. The hard-carbon-film-coated substrate in accordance with claim 6, wherein said intermediate layer provides an improved adhesion of said hard carbon film through said intermediate layer onto said substrate as compared to an adhesion of said hard carbon film directly onto said substrate.

12. The hard-carbon-film-coated substrate in accordance with claim 6, wherein said intermediate layer essentially consists of Si.

13. A hard-carbon-film-coated substrate comprising:

a substrate consisting of a metal or an alloy at least mainly composed of Ni or Al, or stainless steel;

an intermediate layer at least mainly composed of Ge arranged on said substrate; and a predominantly amorphous hard carbon film arranged on said intermediate layer.

14. A hard-carbon-film-coated substrate in accordance with claim 13, wherein said intermediate layer has a thickness of 50 to 8000 Å.

15. A hard-carbon-film-coated substrate in accordance with claim 13, wherein said intermediate layer has a thickness of 50 to 4000 Å.

16. The hard-carbon-film-coated substrate in accordance with claim 13, wherein said hard carbon film is a diamond-like carbon film.

17. The hard-carbon-film-coated substrate in accordance with claim 13, wherein said hard carbon film has a Vickers hardness of about 3000.

18. The hard-carbon-film-coated substrate in accordance with claim 13, wherein said intermediate layer provides an improved adhesion of said hard carbon film through said intermediate layer onto said substrate as compared to an adhesion of said hard carbon film directly onto said substrate.

19. The hard-carbon-film-coated substrate in accordance with claim 13, wherein said intermediate layer essentially consists of Ge.

* * * * *

UNITED STATES PATENT AND TRADEMARK OFFICE
CERTIFICATE OF CORRECTION

PATENT NO. : 5,626,963
DATED : May 6, 1997
INVENTOR(S) : Hirano et al.

It is certified that error appears in the above-identified patent and that said Letters Patent is hereby corrected as shown below:

On the Title Page:

in [54] replace the title to read: --HARD-CARBON-FILM-COATED SUBSTRATE--.

Column 1, lines 2 and 3, delete "AND APPARATUS FOR FORMING THE SAME";
line 46, replace "(At)" by --(Ar)--.

Column 4, line 53, replace "Toor" by --Torr--.

Signed and Sealed this

Twenty-second Day of July, 1997

Attest:

BRUCE LEHMAN

Attesting Officer

Commissioner of Patents and Trademarks